(12) United States Patent
Nelson et al.

(10) Patent No.: US 6,650,546 B2
(45) Date of Patent: Nov. 18, 2003

(54) CHIP COMPONENT ASSEMBLY

(75) Inventors: Jon A. Nelson, Bluffdale, UT (US); Rick Giles, Sandy, UT (US); David Oliphant, West Jordan, UT (US)

(73) Assignee: 3Com Corporation, Santa Clara, CA (US)

( * ) Notice: Subject to any disclaimer, the term of this patent is extended or adjusted under 35 U.S.C. 154(b) by 0 days.

(21) Appl. No.: 09/794,515

(22) Filed: Feb. 27, 2001

(65) Prior Publication Data

US 2002/0118517 A1 Aug. 29, 2002

(51) Int. Cl.$^7$ ................................................. H05K 1/14
(52) U.S. Cl. ...................... 361/738; 361/766; 361/807; 361/736; 361/799; 174/51; 174/35 R
(58) Field of Search ...................... 361/738, 766, 361/763, 799, 803, 807, 830, 736, 748, 753, 800, 818, 816; 174/35 R, 51 R

(56) References Cited

U.S. PATENT DOCUMENTS

| | | | |
|---|---|---|---|
| 2,916,720 A | 12/1959 | Steans | 339/91 |
| 3,205,471 A | 9/1965 | Herrmann | 339/176 |
| 4,029,384 A | 6/1977 | Reinwall, Jr. | 439/92 |
| 4,186,988 A | 2/1980 | Kobler | 339/176 |
| 4,239,316 A | 12/1980 | Spaulding | 439/676 |
| 4,241,974 A | 12/1980 | Hardesty | 339/154 |
| 4,303,296 A | 12/1981 | Spaulding | 339/122 |
| 4,330,360 A | 5/1982 | Kubiak et al. | 439/95 |
| 4,352,492 A | 10/1982 | Smith | 271/1 |
| 4,407,559 A | 10/1983 | Meyer | 339/126 |

(List continued on next page.)

FOREIGN PATENT DOCUMENTS

| | | |
|---|---|---|
| JP | 61-256850 | 8/1985 |
| WO | WO 95/13633 | 5/1995 |

OTHER PUBLICATIONS

U.S. patent application Ser. No. 09/528,331, Oliphant et al., filed Mar. 20, 2000.

(List continued on next page.)

*Primary Examiner*—David Martin
*Assistant Examiner*—Hung Bui
(74) *Attorney, Agent, or Firm*—Workman Nydegger

(57) ABSTRACT

A chip component assembly is provided that includes a plurality of chip components each having respective first and second terminal elements, the first terminal elements being joined to corresponding solder pads on a printed circuit board, the solder pads being in communication with electronic circuitry of the printed circuit board, and the second terminal elements being joined together by an array ground plane of a grounding device. The grounding device additionally includes a ground path structure which physically and electrically connects the array ground plane, and thus the chip components, to a ground pad located on the printed circuit board so as to provide a ground path from the chip components. Preferably, the array ground plane additionally includes a plurality of resilient contact elements which provide for substantial and continuous contact between the array ground plane and an ancillary ground plane, such as the top cover of a PC card. The grounding device serves to foreclose electrostatic discharge or EMI by the chip components and in some applications further serves to direct undesirable noise to ground. The relatively small size of the grounding device permits the use of a relatively smaller ground pad on the printed circuit board, thereby conserving valuable printed circuit board surface area. Finally, the ground path structure is configured for automated attachment to the chip components, and the chip component assembly thus formed is well suited for installation on the printed circuit board by pick-and-place manufacturing techniques.

9 Claims, 3 Drawing Sheets

U.S. PATENT DOCUMENTS

| | | | |
|---|---|---|---|
| 4,428,636 A | 1/1984 | Kam et al. | 339/97 |
| 4,566,749 A | 1/1986 | Johnston | 339/95 D |
| 4,602,842 A | 7/1986 | Free et al. | 339/156 R |
| 4,647,136 A | 3/1987 | Kinoshita et al. | 339/125 R |
| 4,659,869 A | 4/1987 | Busby | 174/35 GC |
| 4,710,136 A | 12/1987 | Suzuki | 439/374 |
| 4,778,410 A | 10/1988 | Tanaka | 439/676 |
| 4,875,872 A | 10/1989 | Tanaka | 439/344 |
| 4,915,648 A | 4/1990 | Takase et al. | 439/490 |
| 4,934,947 A | 6/1990 | Brummans et al. | 439/77 |
| 4,978,317 A | 12/1990 | Pocrass | 439/490 |
| 4,993,959 A | 2/1991 | Randolph | 439/92 |
| 5,011,424 A | 4/1991 | Simmons | 439/352 |
| 5,035,641 A | 7/1991 | Van-Santbrink et al. | 439/329 |
| 5,051,099 A | 9/1991 | Pickles et al. | 439/108 |
| 5,085,601 A | 2/1992 | Buchter et al. | 439/660 |
| 5,112,249 A | 5/1992 | Henry et al. | 439/92 |
| 5,139,439 A | 8/1992 | Shie | 439/359 |
| 5,183,404 A | 2/1993 | Aldous et al. | 439/55 |
| 5,184,282 A | 2/1993 | Kaneda et al. | 361/395 |
| 5,308,251 A | 5/1994 | Kaufman et al. | 439/64 |
| 5,310,360 A | 5/1994 | Peterson | 439/571 |
| 5,336,099 A | 8/1994 | Aldous et al. | 439/131 |
| 5,338,210 A | 8/1994 | Beckham et al. | 439/131 |
| 5,364,294 A | 11/1994 | Hatch et al. | 439/676 |
| 5,391,083 A | 2/1995 | Roebuck et al. | 439/76 |
| 5,391,094 A | 2/1995 | Kakinoki et al. | 439/638 |
| 5,411,405 A | 5/1995 | McDaniels et al. | 439/131 |
| 5,425,660 A | 6/1995 | Weikle | 439/676 |
| 5,429,522 A | 7/1995 | Noschese et al. | 439/133 |
| 5,452,184 A | 9/1995 | Scholder et al. | 439/92 |
| 5,457,601 A | 10/1995 | Georgopulos et al. | 361/686 |
| 5,478,261 A | 12/1995 | Bogese, II | 439/676 |
| 5,481,616 A | 1/1996 | Freadman | 381/90 |
| 5,493,259 A * | 2/1996 | Blalock et al. | 333/182 |
| 5,499,923 A | 3/1996 | Archibald et al. | 439/26 |
| 5,505,633 A | 4/1996 | Broadbent | 439/329 |
| 5,509,811 A | 4/1996 | Homic | 439/55 |
| 5,513,996 A | 5/1996 | Annerino et al. | 439/95 |
| 5,537,294 A * | 7/1996 | Siwinski | 361/753 |
| 5,538,442 A | 7/1996 | Okada | 439/676 |
| 5,547,397 A | 8/1996 | Hirai | 439/607 |
| 5,547,401 A | 8/1996 | Aldous et al. | 439/676 |
| 5,554,821 A | 9/1996 | Patterson et al. | 174/52.2 |
| 5,561,727 A | 10/1996 | Akita et al. | 385/88 |
| 5,562,504 A | 10/1996 | Moshayedi | 439/638 |
| 5,580,274 A | 12/1996 | Tsair | 439/571 |
| 5,594,204 A | 1/1997 | Taylor et al. | 174/52.2 |
| 5,603,620 A * | 2/1997 | Hinze et al. | 439/95 |
| 5,608,607 A | 3/1997 | Dittmer | 361/686 |
| 5,634,802 A | 6/1997 | Kerklaan | 439/131 |
| 5,653,598 A | 8/1997 | Grabbe | 439/66 |
| 5,660,568 A | 8/1997 | Moshayedi | 439/654 |
| 5,667,390 A | 9/1997 | Keng | 439/76.1 |
| 5,677,511 A | 10/1997 | Taylor et al. | 174/52.2 |
| 5,679,013 A | 10/1997 | Matsunaga et al. | 439/144 |
| 5,697,815 A | 12/1997 | Drewnicki | 439/638 |
| 5,702,271 A | 12/1997 | Steinman | 439/676 |
| 5,727,972 A | 3/1998 | Aldous et al. | 439/655 |
| 5,773,332 A | 6/1998 | Glad | 439/344 |
| 5,789,816 A * | 8/1998 | Wu | 257/723 |
| 5,791,943 A | 8/1998 | Lo et al. | 439/676 |
| 5,797,771 A | 8/1998 | Garside | 439/610 |
| 5,816,832 A | 10/1998 | Aldous et al. | 439/131 |
| 5,825,608 A | 10/1998 | Duva et al. | 361/302 |
| 5,836,774 A | 11/1998 | Tan et al. | 439/76.1 |
| 5,861,602 A | 1/1999 | Cox et al. | 219/121.64 |
| 5,876,218 A | 3/1999 | Liebenow et al. | 439/74 |
| 5,879,170 A | 3/1999 | Nogami | 439/76.1 |
| 5,906,496 A | 5/1999 | DelPrete et al. | 439/92 |
| 5,938,480 A | 8/1999 | Aldous et al. | 439/676 |
| 5,957,703 A | 9/1999 | Arai et al. | 439/66 |
| 5,957,714 A | 9/1999 | Johnson et al. | 439/215 |
| 5,975,914 A | 11/1999 | Uchida | 439/66 |
| 5,980,322 A | 11/1999 | Madsen et al. | 439/621 |
| 5,984,731 A | 11/1999 | Laity | 439/676 |
| 5,989,042 A | 11/1999 | Johnson et al. | 439/131 |
| 6,000,956 A | 12/1999 | Henningsson et al. | 439/95 |
| 6,005,774 A | 12/1999 | Chiba et al. | 361/737 |
| 6,022,224 A | 2/2000 | Peters | 439/66 |
| 6,033,240 A | 3/2000 | Goff | 439/131 |
| 6,049,469 A * | 4/2000 | Hood, III et al. | 361/818 |
| 6,058,004 A | 5/2000 | Duva et al. | 361/301.4 |
| 6,071,130 A | 6/2000 | Johnson | 439/92 |
| 6,077,119 A | 6/2000 | Yu et al. | 439/607 |
| 6,089,882 A | 7/2000 | Costello | 439/95 |
| 6,093,059 A | 7/2000 | Bogese | 439/676 |
| 6,102,714 A | 8/2000 | Oliphant et al. | 439/131 |
| 6,106,310 A | 8/2000 | Davis et al. | 439/95 |
| 6,116,962 A | 9/2000 | Laity | 439/676 |
| 6,120,307 A | 9/2000 | Nagel et al. | 439/131 |
| 6,152,779 A | 11/2000 | Madsen et al. | 439/676 |
| 6,166,912 A * | 12/2000 | Morii et al. | 361/737 |
| 6,217,352 B1 | 4/2001 | Oliphant et al. | 439/131 |
| 6,217,391 B1 | 4/2001 | Colantuono et al. | 439/676 |
| 6,239,977 B1 * | 5/2001 | Price et al. | 361/737 |
| 6,326,677 B1 * | 12/2001 | Bloom et al. | 257/638 |
| 6,535,386 B2 * | 3/2003 | Sathe et al. | 361/700 |

OTHER PUBLICATIONS

U.S. patent application Ser. No. 09/528,501, Oliphant et al., Mar. 20, 2000.

P.E. Knight and D.R. Smith, "Electrical Connector for Flat Flexible Cable," IBM Technical Disclosure Bulletin, vol. 25, No. 1, Jun. 1982.

* cited by examiner

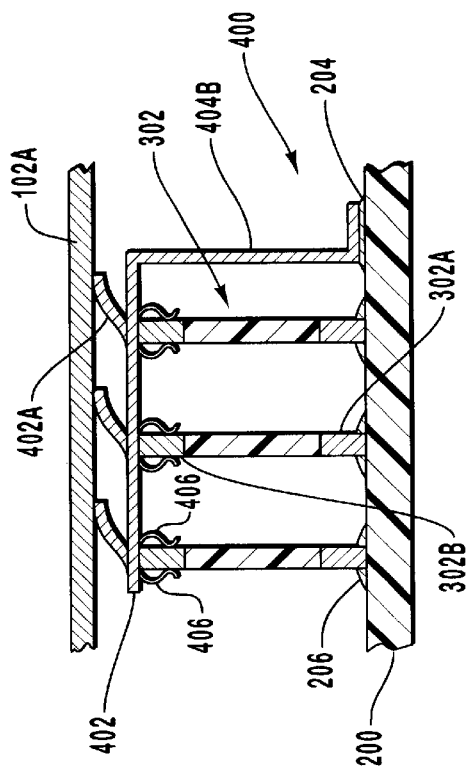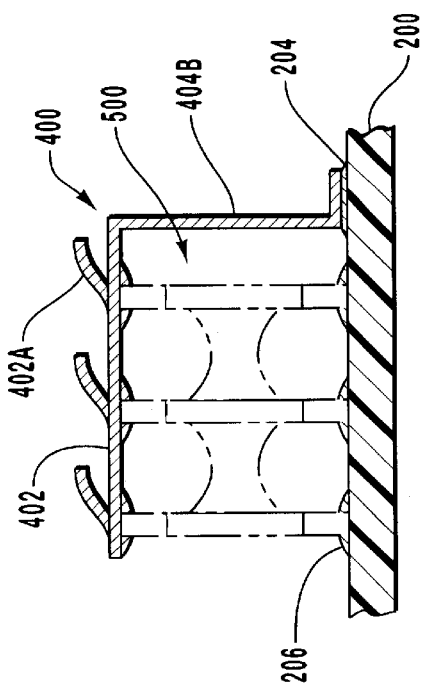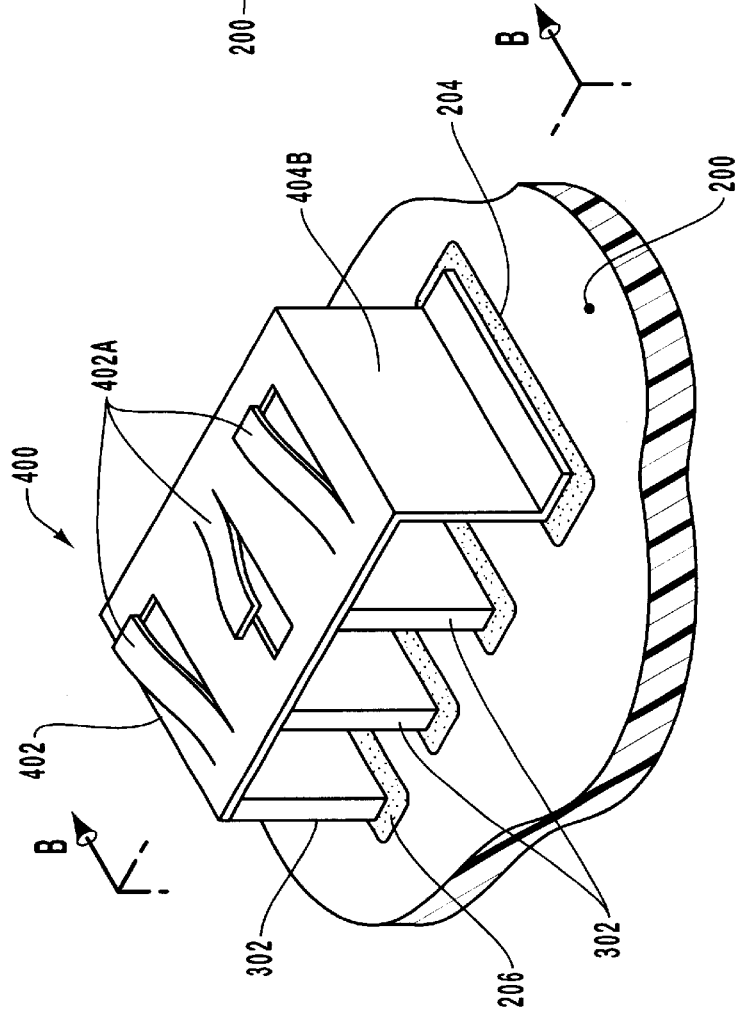

CHIP COMPONENT ASSEMBLY

BACKGROUND OF THE INVENTION

1. The Field of the Invention

The present invention relates generally to printed circuit boards for use in PC cards. More particularly, embodiments of the present invention relate to an improved chip component assembly which streamlines the manufacturing of the PC card while also utilizing relatively less space on the printed circuit board.

2. The Relevant Technology

The ever-increasing demand for personal computers and related equipment may be ascribed to any of a variety of factors. One such factor is that while the capabilities and performance of computers have improved dramatically in recent years, the average cost of computers has also declined during the same period. This divergence in cost and performance has been a significant factor in fueling the demand for personal computers.

Another factor driving the demand for personal computers is the expansion and development of the global computer network commonly known as the "Internet," and related network communications. More and more commercial and non-commercial enterprises are conducting business by way of the Internet, and consumers need personal computers to gain access to the products and information that are available by way of the Internet.

Further, advances in the power and sophistication of computer application software, operating systems, communications software, and peripheral devices have required the development of computers with greater processing speeds and capacities. At the same time however, the pressure to at least maintain, and preferably reduce, the physical size of the computer and its various components has increased as well. Accordingly, downsizing and miniaturization of computer components is an issue of great importance in the industry.

Various efforts are currently underway to maintain, or expand, the power of personal computers and related peripheral devices, while at the same time reducing the size, or form factor, of such computers and devices. In one such effort, manufacturers began to develop miniature portable expansion devices, also known as "PC cards," having smaller sizes. Examples of such PC cards include add-on memory cards, modems, network interface cards, and wireless communication cards. The typical PC card was designed to plug into a port, slot, or socket in the host computer. As a result, PC cards serve to expand the power and capability of the host computer without significantly increasing the size of the physical envelope of the host computer.

As suggested above, PC cards may take a variety of forms and embody a variety of different functionalities. As needs have emerged in the industry, different types of PC cards necessary to implement concepts responsive to those needs have been developed. By way of example, modem PC cards have been developed that are configured to facilitate communication between a host device, in which the modem PC card is received, and various remote devices, such as telephones, networked computers, and the like. Such modem PC cards have become popular due to their small size, relatively low cost, and their ability to interface directly with currently existing RJ-type communication plugs, such as are typically employed in the context of computer network applications.

Notwithstanding the foregoing useful features, various problems and shortcomings have conspired to impede advancement in the art. Many of such problems and shortcomings relate to the chip components typically employed in PC cards, and the related manufacturing and assembly processes.

Known PC cards typically employ a wide variety of components. One example of a component commonly used in PC cards is the so-called chip components. Chip components typically installed in PC cards may include, among other things, chip capacitors, chip inductors, chip resistors, and chip filters. Many known chip components have a body that is characterized by a geometry which includes relatively large opposed upper and lower surfaces, or edges, each of which may be square or rectangular, and four relatively smaller rectangular side surfaces interposed between the upper and lower surfaces. Because such chip components are typically mounted on a printed circuit board (PCB) in a way that the lower surface is arranged in a face-down orientation with respect to the PCB, at least two of the rectangular side surfaces typically have attached thereto respective terminal elements suitable for connecting with corresponding solder pads on the PCB. The terminal elements, in turn, are in electrical communication with various functional elements contained within the chip component.

During assembly, the chip component is mounted so that the respective terminal elements contact corresponding solder pads on the PCB. The chip component can then be permanently joined to the PCB by attaching the respective terminal elements to the appropriate solder pads by soldering. In many cases, the attachment of the chip component to the PCB is accomplished as part of an automated manufacturing process. As discussed in greater detail below however, the aforementioned chip component configurations and installation processes implicate at least one significant problem.

In particular, it is a consequence of typical chip component installation configurations that because the chip component is placed so that the relatively larger square face is oriented face down with respect to the top surface of the printed circuit board, the chip component necessarily takes up relatively more space on the PCB than if, for example, the chip component was mounted edgewise so that one of the relatively smaller rectangular edges was attached to the printed circuit board instead. In view of the demand for PC cards of increasing power and functionality, and the consequent emphasis on efficient use of the limited PCB surface area, such chip placement arrangements are undesirable because they unnecessarily occupy space on the PCB that could otherwise be used to accommodate the installation of additional components.

The foregoing problem is further aggravated by the fact that many of such chip components must be grounded to the printed circuit board and/or other structures in order to assure their continued effective operation and/or the safe and effective operation of the PC card and related devices and components. For example, it is frequently desired to ground chip components so as to preclude electrostatic discharge (ESD) and electro-magnetic interference (EMI) that can impair the functionality and operability of the PC card in which the chip components are installed.

As another example, in modem PC cards, a group of chip capacitors is commonly employed to provide the dual functions of providing a common alternating current (AC) reference between the modem and the telephone line to which the modem is connected, as well as capturing high frequency noise at the modem and returning the high frequency noise to ground before it can be transmitted down the telephone line. In order that they can effectively and reliably implement the aforementioned functionalities, the chip capacitors must be grounded.

Typically, the grounding of chip components, such as the chip capacitors discussed above, is accomplished through some type of grounding device that must be connected both to the chip component and to a ground pad on the PCB. As a consequence of such configurations, many known grounding devices act to further increase the amount of PCB space required to accommodate installation of the chip component. As noted above, such a result is at cross purposes with the overarching desire and need to maximize the functionality of PC cards.

In view of the foregoing problems, various attempts have been made to develop arrangements of chip components, and related grounding devices, directed toward facilitating more efficient use of the available space on the PCB. One technique commonly employed is the reorientation of the various chip components so that they are mounted on edge in the PCB in a so-called "tombstone" orientation. One benefit of such an arrangement is that, due to the relatively smaller "footprint" of the edge of the chip component, as compared to the face of the chip component, relatively less space is required on the PCB to accommodate installation of the chip component and, accordingly, a greater number of chip components can be mounted in a given area on the PCB.

In an effort to improve the utility of such arrangements, "banks," or arrays, of chip components have been developed that include a plurality of chip components glued to each other by way of adhesive or the like. Because the individual chip components are glued to each other, such an array permits a plurality of chip components to be installed on the printed circuit board in a single operation. While known chip component arrays contribute to an increase in the efficiency with which PCB space is utilized, they nevertheless suffer from a variety of problems and shortcomings.

As noted above, the grounding of chip components is important for a variety of reasons. To those ends, known chip component arrays typically require one or more grounding devices. However, because such grounding devices must connect with a plurality of components in order to effectively ground all such components, many known grounding devices are typically relatively large and bulky components that occupy a relatively large portion of space inside the PC card and accordingly serve to preclude the installation of additional components that could otherwise be employed.

Furthermore, it is often the case that known grounding devices are installed by hand only after the chip component array has been secured to the printed circuit board. For example, in some arrangements, an "S" shaped grounding clip is employed that receives the edge of the PCB, so as to come into contact with a trace or ground pad on the PCB, and includes an extending portion which contacts the housing of the PC card, thereby grounding the PCB to the housing.

Due to the relatively large size of such grounding clips, and the limited precision with which a human can manipulate and assemble small devices such as PC cards and their component parts, the grounding pad on the PCB to which the grounding device must be attached is relatively large. The relatively large size of the grounding pad required by the grounding device acts as yet another limitation on the available space on the PCB and, accordingly, the efficiency with which such space is used.

Another problem associated with such known arrangements concerns associated manufacturing processes. In particular, such chip component array and grounding device arrangements typically implicate at least two installation steps. In the first step, the chip component array is placed on the PCB by one of a variety of well known technique assembly techniques, such as pick-and-place. However, because the grounding device is separate from the chip component array, an additional step is required to attach the grounding device to the chip component array and the PCB. As noted above, the inefficiency of the manufacturing process is further aggravated by the face that the grounding device typically is not placed by a machine but rather must be placed manually on the PCB.

Note that in situations where a chip component array is not employed, the efficiency of the assembly process is further impaired. In particular, each chip component must be placed in a separate operation on the PCB, and then a grounding device manually connected to the PCB and the separately placed chip components. Such processes tend to impair both the speed and the quality associated with the manufacturing of the PC card and accordingly contribute to an increase in the overall cost of the PC card.

Finally, it is frequently desirable to ground chip components both to the PCB as well as to another, ancillary, ground plane. Typically, such grounding has been achieved through the use of at least two separate grounding devices. However, the use of two grounding devices complicates the PC card assembly process and accordingly contributes to an overall increase in the cost of the PC card.

In view of the foregoing problems and shortcomings, and others with existing chip component arrangements and associated grounding devices, it would be an advancement in the art to provide a chip component assembly including an array of chip components oriented to minimize the overall footprint of the chip component assembly on a printed circuit board. Additionally, the chip component assembly should include a grounding device arranged to ground the chip component assembly to the PCB as well as to the housing of the PC card, and which requires only a relatively small ground pad on the PCB. Further, the chip component assembly should obviate the need for any manual steps in the construction of the chip component assembly and the placement of the chip component assembly on the PCB. Finally, the chip component assembly should be well suited for use in conjunction with pick-and-place manufacturing techniques.

SUMMARY AND OBJECTS OF THE INVENTION

The present invention has been developed in response to the current state of the art, and in particular, in response to these and other problems and needs that have not been fully or adequately resolved by currently available chip component assemblies. Thus, it is an overall object of embodiments of the present invention to provide a chip component assembly which includes an arrangement of chip components that promotes efficient use of the surface area of the PCB to which the chip component array is mounted, while also lending itself to use in conjunction with pick-and-place manufacturing processes, and which includes a grounding device that facilitates grounding of an array of chip components both to a PCB and a secondary ground plane.

Embodiments of the present invention are well suited for use in the context of PC cards and the like. However, it will be appreciated that embodiments of the present invention are suitable for use in any application or environment where it is desired to employ a chip component assembly that may be grounded to or contacting at least two different structures while at the same time maximizing the efficiency with which the surface area of a PCB is utilized, and which can be readily installed using pick-and-place manufacturing.

In one embodiment of the present invention, a chip component assembly is provided that includes a plurality of chip components, preferably capacitors, each having first and second terminal elements. An array ground plane, preferably comprising solder coated phosphor bronze, of the chip component assembly includes structure configured to receive, or otherwise cooperate with, the respective second terminal elements of the chip components and is soldered thereto so as to maintain the chip components in a desired arrangement with respect to each other and so that the array ground plane is electrically connected to the respective second terminal elements. Preferably, the chip components are arranged so that their respective first terminal elements can be joined to electronic circuitry of a printed circuit board.

The array ground plane additionally includes a grounding leg, preferably integral with the array ground plane, that physically and electrically connects the array ground plane to a grounding pad on the PCB to which the chip component assembly is mounted. Finally, the array ground plane includes a plurality of resilient contact elements which serve to establish and maintain substantial and continuous physical contact between the array ground plane and an adjacent ancillary ground plane when the chip component assembly is disposed inside the PC card. Preferably the ancillary ground plane comprises the electrically conductive upper cover of the PC card housing.

Due to the edge mounted, or "tombstone," orientation of the chip components, the chip component assembly is effective in promoting a relatively more efficient use of available surface area on the PCB to which it is mounted. Further, the configuration and disposition of the array ground plane and ground path structure facilitates simultaneous grounding of the chip component assembly to the PCB as well as to the ancillary ground plane. Finally, because the chip component assembly is manufactured prior to placement on the printed circuit board, it is well suited for use in conjunction with pick-and-place manufacturing techniques and thus eliminates the costs typically associated with partial or complete manual assembly and placement.

In operation, the functionality of the chip component assembly is facilitated by the connections between the respective first and second terminal elements of the chip capacitors and the electronic circuitry on the printed circuit board. Any electrostatic charge buildup, or undesirable noise, in the chip component assembly is safely drained from the chip component assembly by way of the array ground plane and ground path structure. In one embodiment of the present invention, the chip component assembly serves to provide a common AC reference between a modem in the PC card and the telephone line to which the modem is connected.

These and other objects and features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages and features of the invention are obtained, a more particular description of the invention briefly described above will be rendered by reference to specific embodiments thereof which are illustrated in the appended drawings. Understanding that these drawings depict only typical embodiments of the invention and are not therefore to be considered limiting of its scope, the invention will be described and explained with additional specificity and detail through the use of the accompanying drawings in which:

FIG. 3A is a perspective view of an alternative embodiment of a chip component assembly according to the present invention;

FIG. 3B is a section view taken along line B—B of FIG. 3A and illustrates various details concerning the arrangement of selected components of a chip component assembly; and FIG. 3C is a section view taken along line B—B of FIG. 3A and illustrates details concerning the arrangement of an embodiment of a grounding device with respect to a chip component array.

DETAILED DESCRIPTION OF EMBODIMENTS OF THE INVENTION

Reference will now be made to figures wherein like structures will be provided with like reference designations. It is to be understood that the drawings are diagrammatic and schematic representations of various embodiments of the claimed invention, and are not to be construed as limiting the present claimed invention, nor are the drawings necessarily drawn to scale.

Figure 1:
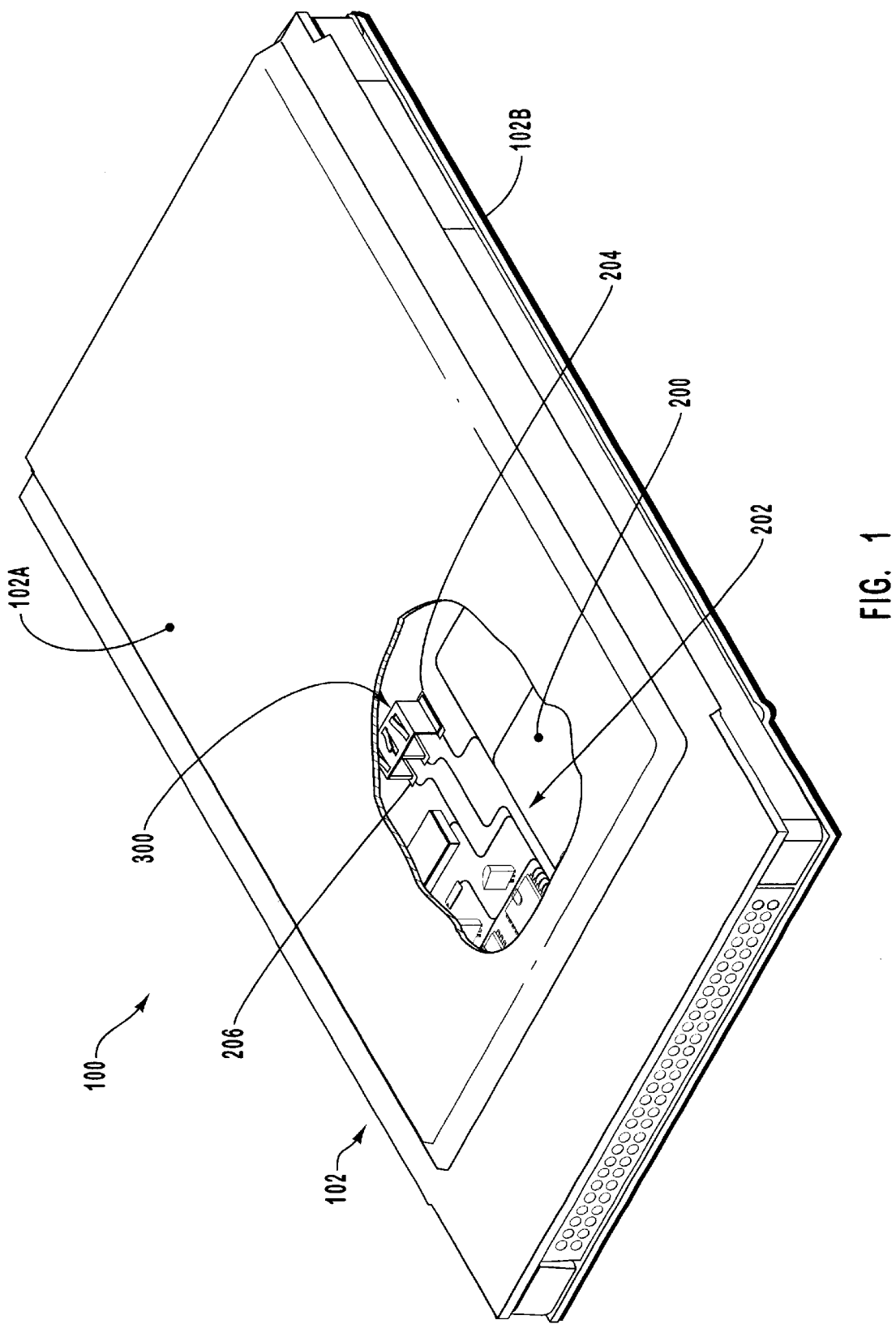
FIG. 1 is a perspective view of an exemplary environment for embodiments of the present invention.

Reference is first made to FIG. 1, wherein a PC card is indicated generally at 100. It will be appreciated that PC card may take any of a variety of forms including, but not limited to, a memory card, modem card, network card, or the like. It will likewise be appreciated that PC card 100 is an exemplary operating environment, and that embodiments of the present invention may be profitably employed in a wide variety of other environments as well. In general, embodiments of the present invention are suitable for use in any environment where printed circuit boards (PCB) are employed.

In the illustrated embodiment, PC card 100 includes a housing 102 having a top cover 102A and a bottom cover 102B which cooperate to define a space in which PCB 200 is disposed. PCB 200 includes electronic circuitry 202 that is in electrical communication with one or more ground pads 204 and one or more solder pads 206. Mounted to PCB 200 are one or more chip component assemblies 300. In general, chip component assembly 300 communicates with electronic circuitry 202 by way of solder pads 204 and associated traces. Further, chip component assembly 300 is grounded by way of an electrical connection between chip component assembly 300 and ground pad 204. In at least some embodiments of the present invention, chip component assembly 300 also contacts top cover 102A of housing 102 so as to be grounded thereto.

Figure 2C:
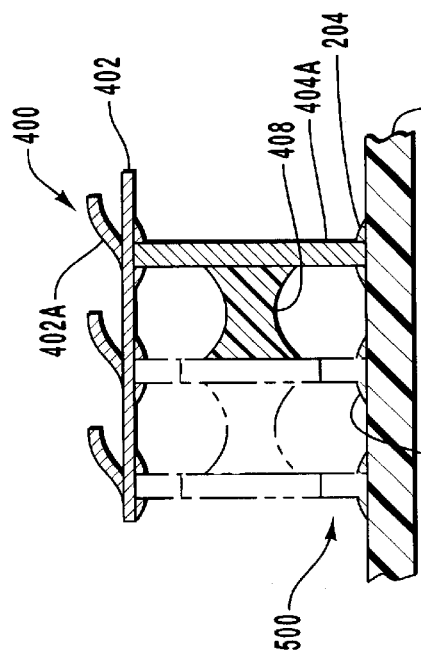
FIG. 2C is a section view taken along line A—A of FIG. 2A and illustrates details concerning the arrangement of an embodiment of a grounding device with respect to a chip component array.
Figure 2B:
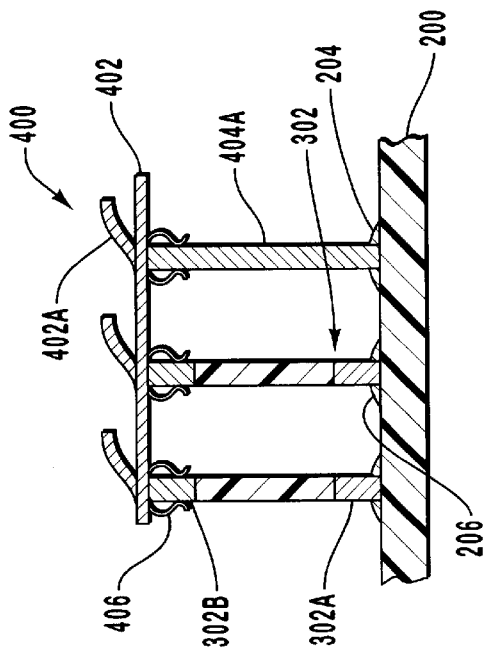
FIG. 2B is a section view taken along line A—A of FIG. 2A and illustrates various details concerning the arrangement of selected components of a chip component assembly.
Figure 2A:
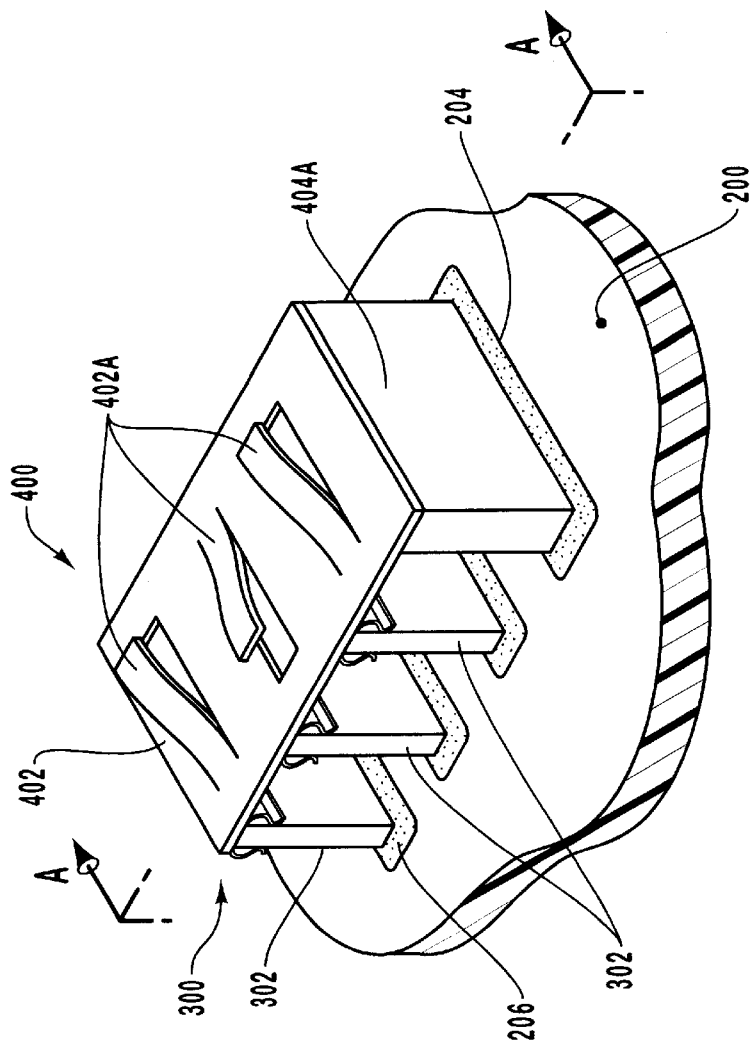
FIG. 2A is a perspective view of one embodiment of a chip component assembly according to the present invention.

Directing attention now to FIG. 2A, various details are provided regarding features of an embodiment of the present invention. In particular, chip component assembly 300 includes a plurality of chip components 302 arranged so that each contacts a respective solder pad 206. As discussed in greater detail below, the particular desired arrangements of chip components 302 with respect to each other may be achieved in a variety of different ways.

It will be appreciated that chip component assembly 300 may incorporate any of a variety of functionalities. Consistent with the foregoing, it will be appreciated that each chip component 302 may take any of a variety of forms, including, but not limited to, chip semiconductors, tip capacitor, ring capacitor, high current impedance chips, chip capacitors, chip inductors, chip beads, and chip filters. It will further be appreciated that variables including, but not limited to, the types and numbers of chip components 302 included in chip component assembly 300 may be varied as required to suit a particular application and/or to facilitate achievement of one or more desired results.

As indicated in the illustrated embodiment, chip components 302 are preferably mounted in an edgewise, or "tombstone," orientation wherein the relatively longer axis of each chip component 302 is perpendicularly oriented with respect to the top surface of PCB 200. Such an arrangement has the benefit, among others, of utilizing relatively less PCB 200 surface area than would be the case where chip components 302 are arranged so that their respective longer axes are parallel to the top surface of PCB 200.

Directing continuing attention to FIG. 2A, chip component assembly 300 further includes a grounding device 400 in contact with each chip component 302. In the illustrated embodiment, grounding device 400 includes an array ground plane 402, preferably comprising solder coated phosphor bronze, having a plurality of contact elements 402A. In general, contact elements 402A are configured and arranged to contact an ancillary ground plane, preferably top cover 102A (not shown) of housing 102 (see, e.g., FIG. 3B), when PCB 200 is disposed in PC card 100, thereby providing a ground path from chip components 302.

It will be appreciated that variables including, but not limited to, the size, number, shape, and arrangement of contact elements 402A may be varied either alone or in various combinations as required to suit a particular situation and/or to facilitate achievement of one or more desired results. Preferably, contact elements 402 are integral with array ground plane 402, but may alternatively comprise separate structures joined to array ground plane 402, and are resilient so as to be slightly compressed by the ancillary ground plane. The resilience of contact elements 402 promotes substantial and continuous contact between array ground plane 402 and the ancillary ground plane under a variety of conditions.

For example, contact elements 402 are well suited to accommodate any relative displacement between PCB 200 and the ancillary ground plane, such as may result from thermal expansion and contraction, and also to compensate for any misalignment or the like that may occur during assembly of PC card 100. Note that, with respect to the grounding of chip components 302, the use of an ancillary ground plane is discretionary, and may be eliminated as/if desired. In either case, embodiments of the present invention provide for grounding of chip components 302 in another manner as well.

In particular, grounding of chip components 302 is also provided by way of ground path structure 404A of grounding device 400. Generally, ground path structure 404A serves to electrically connect array ground plane 402 with ground pad 204 so as to ground chip components 302. It will be appreciated that the functionality provided by ground path structure 404A may be implemented by a variety of different structures. As indicated in the illustrated embodiment, one exemplary structure is a so-called "dummy chip." The dummy chip is preferably characterized by a geometry substantially similar to that of chip components 302 and is comprised of an electrically conductive material chemically and thermally compatible with array ground plane 402 and suitable for joining to array ground plane 402 and ground pad 204 by soldering or similar processes.

One benefit of the use of a ground path structure 404A in the form of a dummy chip is that array ground plane 402 can be made simply of a flat piece of metal, adapted to receive a plurality of chip components 302 and ground path structure 404A, without requiring any further modification for implementing the grounding functionality described herein. As with the case of chip components 302, the illustrated embodiment of ground path structure 404A may additionally be soldered to clips 406 of array ground plane 402. It will be appreciated the variables including, but not limited to, the orientation and spacing of ground path structure 404A, with respect to chip components 302, may be varied as required to suit a particular application and/or to facilitate achievement of one or more desired results.

Another advantage of a ground path structure 404A in the form of a dummy chip is that a special ground pad 204 need not be provided, rather, the ground pad 204 for such a ground path structure 404A is the same as the solder pads 206 used by chip components 302. Such use of uniform solder pads 206 contributes to the ease of manufacture of PCB 200. Further, it will be appreciated that because grounding device 400 is preferably attached to chip components 302 prior to placement of chip component assembly 300 on PCB 200, ground path structure 404A may be employed with a relatively smaller ground pad 204 than would be required in the case where a grounding device, such as the known "S" type grounding devices, is placed on PCB 200 by hand.

Thus, the arrangement of chip components 302 and grounding device 400 indicated in the illustrated embodiment serves not only to effectively ground chip components 302, but also to speed the manufacturing process and to promote a relative increase in the efficiency with which PCB 200 space is utilized, by requiring relatively less space on PCB 200 than is typically needed by known devices.

In addition to the structural and manufacturing advantages presented by embodiments of the present invention, the grounding functionality provided by array ground plane 402, contact elements 402A, and ground path structure 404A provides various useful benefits as well. For example, electrostatic discharge (ESD) from chip component assembly 300 is substantially precluded because the ground connection prevents charge build up. Thus, any charge in chip component assembly 300 is safely drained away through the ground path before a potentially destructive ESD can occur. Additionally, as described in further detail below, where chip components 302 comprise tip and ring capacitors such as would be employed in a modem PC card, grounding device 400 permits such chip components to act as a low pass filter which captures undesirable high frequency noise generated by the computer in which PC card 100 is disposed and returns the noise to ground before it can be transmitted down the phone line to which the computer is connected.

Directing attention now to FIG. 2B, additional details are provided regarding various features of chip component assembly 300. In particular, each chip component 302 of chip component assembly 300 includes respective first terminal elements 302A and second terminal elements 302B. Both first and second terminal elements 302A and 302B are electrically conductive so as to facilitate implementation of the functionality of the particular chip component 302 of which they are a part. In the case of a chip resistor, for example, a first terminal element 302A and a second terminal element 302B are each connected to a resistive element disposed within the chip resistor. As another example, in the case of a chip capacitor, first terminal element 302A and a second terminal element 302B comprise the oppositely charged plates of the chip capacitor, and are separated by a suitable dielectric.

Depending upon such considerations as the particular application for chip component assembly 300, and the amount of available space on PCB 200, chip components 302 may be arranged in a variety of configurations. To that end, array ground plane 402 includes a plurality of electrically conductive clips 406, arranged to comport with a particular desired configuration of chip components 302, and resilient so as to receive and securely retain a second terminal element 302B of a chip component 302. Further, a ground path structure 404A in the form of a dummy chip is also readily received in, and retained by, clips 406.

Thus, clips 406 serve to facilitate establishment and maintenance of a predetermined arrangement of chip components 302 and ground path structure 404A and, accordingly, a particular chip component assembly 300 can be easily customized for a specific application by simply selecting desired chip components 302 and inserting each into a set of clips 406 corresponding with the location desired for that chip component. Note that in one embodiment of the present invention, second terminal elements 302B are soldered to the respective clips 406 in which they are received, so as to further improve the physical and electrical connection between chip components 302 and array ground plane 402.

It will be appreciated from the foregoing that clips 406 permit chip components 302 to be joined to grounding device 400 prior to placement of chip component assembly 300 on PCB 200. Accordingly, chip component assembly 300 can be assembled in its entirety before placement on PCB 200. Further, because chip components 302 can be joined to clips 406 by a machine, the assembly of chip component assembly 300 can be completely automated. Thus, embodiments of the present invention represent an advancement over known systems and devices which require the additional manufacturing step of manual attachment of the grounding device.

As noted earlier, some known chip component arrays comprise a plurality of chip components that are joined to each other in a desired arrangement by way of an adhesive material. Accordingly, another advantage provided by clips 406 is that the need for the use of adhesives and related processes is foreclosed, thereby simplifying the manufacturing process, and reducing costs associated with assembly of PCB 200.

Directing continued attention now to FIG. 2B, respective first terminal elements 302A of chip components 302 are physically and electrically connected to electronic circuitry 202 (not shown) by way of solder pads 206. In similar fashion, ground path structure 404 physically and electrically connects array ground plane 402, and thus chip components 302, to ground by way of ground pad 204.

Finally, it will be appreciated that chip components 302 may be joined to grounding device 400 other than by way of clips 406. By way of example, second terminal elements 302B of chip components 302 may be configured to engage or otherwise mate with corresponding structure on grounding device 400. In general, any structure that permits or facilitates the secure attachment and retention of chip components 302 with respect to grounding device 400, so as to facilitate the establishment of a predetermined arrangement of chip components 302, is contemplated as being within the scope of the present invention.

Turning now to FIG. 2C, various details are provided regarding the use of an embodiment of grounding device 400 in conjunction with a chip component array 500. As many features of the illustrated embodiment of grounding device 400 are discussed in the context of FIGS. 2A and 2B, among others, no additional discussion of such features is required.

In general, chip component array 500 includes a plurality of chip components joined to each other by adhesive. With the exception of such adhesive, the component parts of chip component array 500 are substantially similar in geometry, features, and functionality as chip components 302 disclosed elsewhere herein. Because chip component array 500 employs adhesive to facilitate a desired arrangement, grounding device 400 need not include clips 406. Note however that, depending upon the application and various other constraints and considerations, clips 406 may be employed if desired, to join chip component array 500 and/or ground path structure 404B to array ground plane 402.

In the illustrated embodiment, ground path structure 404A is joined to an end of chip component array 500 by adhesive 408, preferably a high temperature epoxy or the like, and additionally, or alternatively, ground path structure 404A may be joined to array ground plane 402 by soldering or the like. Further, array ground plane 402 is soldered or otherwise joined to the terminal elements of chip component array 500. In this way, chip component array 500 and grounding device 400 can be joined together prior to placement on PCB 200. Further, the gluing of ground path structure 404B to chip component array 500, and the soldering of array ground plane 402 to chip component array 500 are preferably accomplished by machine. As discussed herein, such automated assembly has the desirable effect of, among other things, reducing assembly time and cost. The whole, comprising chip component array 500 and grounding device 400, can then be attached to PCB 200 by a pick-and-place process or other suitable manufacturing and assembly technique(s).

Directing attention now to FIG. 3A, various details are provided regarding alternative embodiments of chip component assembly 300 and grounding device 400. Generally, the illustrated embodiment of grounding device 400 is substantially similar to the embodiment that is the subject of FIG. 2A, except that ground path structure 404A (FIG. 2A) is replaced with ground path structure 404B attached to ground pad 204. Preferably, ground path structure 404B is in the form of a grounding leg integral with array ground plane 402. Thus, grounding device 400 may be readily constructed of a single piece of material bent into the form required to suit the intended application.

It will be appreciated however that in an alternative embodiment, array ground plane 402 and ground path structure 404B may comprise separate components. In either event, grounding device 400 is joined to chip components 302 prior to placement of chip component assembly 300 on PCB 200, in the manner discussed in the context of other embodiments of the present invention. As in the case of ground path structure 404A, the attachment of ground path structure 404B to chip components 302, and ultimately to ground pad 204, is preferably accomplished by machine. In this regard, at least, the illustrated embodiment of grounding device 400 represents an improvement over known grounding devices which require the use of manual installation techniques.

With reference now to FIGS. 3B and 3C, additional details are provided regarding grounding array 400. Generally, the illustrated embodiment of grounding device 400 indicated in FIGS. 3B and 3C is substantially similar to the embodiment that is the subject of FIGS. 2B and 2C, respectively, except that ground path structure 404A (FIGS. 2B and 2C) is replaced with ground path structure 404B, as shown. Various details regarding features and arrangement of ground path structure 404B are provided herein in the context of the discussion of FIG. 3A. With respect to FIG. 3C, it will be appreciated that ground path structure 404B may be joined to chip component array 500 by way of adhesive or the like, if desired for additional strength and stability. Further, chip component array 500 may alternatively be retained in clips 406 (not shown) of array ground plane 402.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by U.S. Letters Patent is:

1. A chip component assembly suitable for use in connection with a printed circuit board that includes electronic circuitry and a ground pad disposed on a top surface of the printed circuit board, the printed circuit board being configured to be substantially disposed within a housing of an electronic component, the chip component assembly comprising:

an array of chip components, each chip component including respective first and second terminal elements, and each of the chip components being mounted to the top surface of the printed circuit board in an edgewise orientation and extending upwardly from the top surface of the printed circuit board so that the respective first terminal elements are joined at least indirectly to the top surface of the printed circuit board while each of the respective second terminal elements are disposed in a position above the top surface of the printed circuit board;

an array ground plane contacting each of the respective second terminal elements so that the array ground plane is interposed between the chip components and the housing when the chip component assembly is disposed in the housing, and the array ground plane being in contact with the housing when so disposed; and a ground path structure configured and arranged to electrically connect the ground pad and the array ground plane.

2. The chip component assembly as recited in claim 1, wherein the array of chip components includes at least one of: a tip capacitor; a ring capacitor; a chip semiconductor; a high current impedance chip; a chip inductor; a chip capacitor; a chip bead; a chip resistor; and, a chip filter.

3. The chip component assembly as recited in claim 1, wherein the array ground plane comprises a plurality of clips, each of said clips receiving a corresponding second terminal element of a chip component.

4. The chip component assembly as recited in claim 1, wherein the array ground plane comprises at least one resilient contact element configured and arranged to contact the housing when the chip component assembly is disposed within the housing.

5. The chip component assembly as recited in claim 1, wherein the ground path structure comprises a component selected from the group consisting of: a dummy chip; and, an integral grounding leg.

6. The chip component assembly as recited in claim 1, wherein the array ground plane substantially comprises solder coated phosphor bronze.

7. The chip component assembly as recited in claim 1, wherein the ground path structure is joined to one of the chip components by an adhesive.

8. The chip component assembly as recited in claim 1, wherein each chip component is joined to an adjacent chip component by an adhesive.

9. The chip component assembly as recited in claim 1, wherein the array ground plane comprises a single piece of material.

* * * * *